United States Patent [19]

Collins et al.

[11] Patent Number: 5,098,737
[45] Date of Patent: Mar. 24, 1992

[54] AMORPHIC DIAMOND MATERIAL PRODUCED BY LASER PLASMA DEPOSITION

[75] Inventors: Carl B. Collins, Richardson; Farzin Davanloo, Dallas, both of Tex.

[73] Assignee: Board of Regents The University of Texas System, Austin, Tex.

[21] Appl. No.: 521,694

[22] Filed: May 9, 1990

Related U.S. Application Data

[63] Continuation-in-part of Ser. No. 264,224, Oct. 28, 1988, which is a continuation-in-part of Ser. No. 183,022, Apr. 18, 1988, Pat. No. 4,987,007.

[51] Int. Cl.$^5$ .................... B05D 3/06; B05D 5/12; C23C 16/00; B01J 3/06
[52] U.S. Cl. .................... 427/53.1; 427/122; 427/249; 423/446
[58] Field of Search .................... 427/53.1, 122, 249; 423/446

[56] References Cited

U.S. PATENT DOCUMENTS

| | | | |
|---|---|---|---|
| 4,248,909 | 2/1981 | Whittaker | 427/53.1 |
| 4,701,592 | 10/1987 | Cheung | 427/53.1 |
| 4,987,007 | 1/1991 | Wagal et al. | 427/38 |

FOREIGN PATENT DOCUMENTS

WO89/10427 11/1989 PCT Int'l Appl.
2155042A 9/1985 United Kingdom.

OTHER PUBLICATIONS

Collins, C. B. et al., "Plasma Source of Amorphic Diamond", Appl. Phys. Lett. 54(3):216-218 (Jan. 16, 1989).
Wagal, S. S. et al., "Diamond-Like Carbon Films Prepared with a Laser Ion Source", Appl. Phys. Lett. 53(3):187-188 (Jul. 19, 1988).
Davanloo et al., "Amorphic Diamond Films Produced by a Laser Plasma Source", J. Appl. Phys. 67(4), (Feb. 15, 1990).
N. Savvides, "Optical Constants and Associated Functions of Metastable Diamondlike Amorphous Carbon Films in the Energy Range 0.5-7.3 eV", J. Appl. Phys., 59(12), 15 Jun. 1986.
Sato, et al., "Diamond-Like Carbon Films Prepared by Pulsed-Laser Evaporation", Appl. Phys., A 45:355-360, 1988.
Cheung et al., "Growth of Thin Films by Laser-Induced Evaporation", Critical Review in Solid State and Material Sciences, 15(1) (1988).
R. Nemanich et al., "Raman Scattering Characterization of Carbon Bonding in Diamond and Diamondlike Thin Films", J. Vac. Sci. Technol. A 6(3):1783 (1988).
Berger et al., "EELS Analysis of Vacuum Arc-Deposited Diamond-Like Films", Philosophical Magazine Letters, 57(6):285 (1988).
R. Shroder et al., "Analysis of the Composite Structures in Diamond Thin Films by Raman Spectroscopy", Physics Review B, vol. 41, No. 6, (Feb. 15, 1990-II), pp. 3738-3745.
Kitahama et al., "Synthesis of Diamond by Laser-Induced Chemical Vapor Deposition", Appl. Phys. Lett., 49(11):634-635 (1986), Sep. 15, 1986.
Messier et al., "From Diamond-Like Carbon to Diamond Coatings", Thin Solid Films, 153:1-9 (1987).

(List continued on next page.)

Primary Examiner—Evan Lawrence
Assistant Examiner—Marianne L. Padgett
Attorney, Agent, or Firm—Arnold, White & Durkee

[57] ABSTRACT

A method and apparatus are disclosed for producing amorphic or ultra fine-grained, diamond-like material on a substrate. Uniform, high quality dehydrogenated diamond-like material is produced when a hardened target material is used and/or when a laser beam strikes the target at non-perpendicular angles of incidence. Also, selective placement of particles upon a substrate as well as simultaneous cleaning of the substrate is achieved by a secondary electrode placed within the laser beam path of travel between a first electrode and the substrate.

6 Claims, 3 Drawing Sheets

OTHER PUBLICATIONS

Kitabatake et al., "Growth of Diamond at Room Temperature by an Ion-Beam Sputter Deposition Under Hydrogen-Ion Bombardment", *J. Appl. Phys.*, 58(4):1693–1695 (1985).

Sato et al., "Deposition of Diamond-Like Carbon Films by Pulsed-Laser Evaporation", *Japanese J. of Appl. Phys.*, 26(9):L1487–L–1488 (1987).

Mirtich et al., "Diamondlike Carbon Protective Coatings for IR Materials", no date.

Angus et al., "Low-Pressure, Metastable Growth of Diamond and 'Diamond-Like' Phases", Science, 241:913–921 (1988), Aug. 19, 1988.

Richter et al., "About the Structure and Bonding of Laser Generated Carbon Films by Raman and Electron Energy Loss Spectroscopy", *J. Non-Crystalline Solids*, 88:131–144 (1986).

Marquardt et al., *Deposition of Amorphous Carbon Films From Laser-Produced Plasmas*, Mat. Res. Soc. Symp. Proc., 38 (1985).

AMORPHIC DIAMOND MATERIAL PRODUCED BY LASER PLASMA DEPOSITION

BACKGROUND OF THE INVENTION

This application is a continuation-in-part of Ser. No. 264,224, filed Oct. 28, 1988, which is a continuation-in-part of Ser. No. 183,022, filed Apr. 18, 1988 and issued Jan. 22, 1991 as Pat. No. 4,987,007.

This invention relates to an apparatus and method for producing a layer of material on a substrate by laser ablation in a vacuum environment. In particular, the invention relates to an apparatus, method and product for depositing a layer of amorphic or ultra fine-grained, diamond-like material on a substrate using improved feedstock material. The improved feedstock or target material greatly reduces the ejection of macroscopic particles, thus preventing uneven growth rate upon the substrate. The present invention achieves uniform growth rates across the substrate (0.5 microns per hour) at a real index of refraction (i.e., real part of the complex index of refraction) approaching pure diamond (approximately 2.4), and an imaginary index of refraction (i.e., imaginary part of the complex index of refraction) less than 1.0, and an abundance of $sp^3$ tetrahedral bonding. Amorphic diamond-like material can be placed at selective points upon the substrate by discharging a secondary electrode disposed between the substrate and a primary electrode, wherein both primary and secondary electrodes are placed within the travel path of the laser beam and between the substrate and target.

In recent years, there has been great interest in producing diamond-like carbon coating for a variety of reasons. First, diamond-like carbon is an extremely hard surface nearly impervious to physical abuse (abrasive or chemical) and is therefore quite useful as a protective surface. Diamond-like carbon is optically transparent (in e.g., the infrared spectrum), and is therefore believed to be useful in a variety of optics applications such as protecting sensor optical circuits, quantum wells, etc. In addition, diamond-like carbon has been found to have a high electrical resistivity as well as high thermal conductivity —an unusual combination. Diamond-like carbon when doped, can act as a semiconductor, thereby forming the basis of technology for microcircuitry which can operate under hostile conditions of high temperatures and radiation levels. Therefore, there has been great interest in developing techniques for obtaining diamond-like carbon films in commercial quantities for possible use in the semiconductor industry.

Natural diamond has the highest hardness and elastic modulus of any material. Diamond is the least compressible substance known, has the highest thermal conductivity and a low thermal expansion coefficient. Further, diamond is a wide band gap semiconductor, having a high breakdown voltage ($10^7$ V/cm) in a saturation velocity ($2.7 \times 10^7$ cm/s) greater than silicon, gallium arsinide, or indium phosphide. Thus, it is postulated that diamond-like carbon films would also be useful in the electronics industry as a protective, resistive coating with extremely desirable heat sink properties.

Currently, there are four major methods being investigated for producing diamond-like carbon films: (1) ion beam deposition; (2) chemical vapor deposition; (3) plasma enhanced chemical vapor depositions; and (4) sputter deposition.

The ion beam deposition method typically involves producing carbon ions by heating a filament and accelerating carbon ions to selected energies for deposit on a substrate in a high vacuum environment. Ion beam systems use differential pumping and mass separation techniques to reduce the level of impurities in the carbon ion fluence to the growing film. While films of diamond-like carbon having desirable properties can be obtained with such ion beam techniques, the films are expensive to produce and are only achievable at very slow rates of growth on the order of 50 angstroms per day.

The chemical vapor deposition and plasma enhanced chemical vapor deposition methods are similar in operation and associated problems. Both methods use the dissociation of organic vapors such as $CH_3OH$, $C_2H_2$, and $CH_3OHCH_3$ to produce both carbon ions and neutral atoms of carbon for deposit on a substrate. Unfortunately, the collateral products of dissociation frequently contaminate the growing film. While both chemical vapor deposition and plasma enhanced chemical vapor deposition achieve film growth rates of practical levels, such films are of poor optical quality and unsuitable for most commercial uses. Further, expitaxial growth is simply not possible using chemical vapor deposition techniques.

Sputtering deposition usually includes two ion sources, one for sputtering carbon from a graphite source onto a substrate, and another ion source for breaking the unwanted graphite bonds in the growing film. For example, an argon ion sputtering gun sputters pure carbon atoms off of a graphite target within a vacuum chamber, and the carbon atoms are condensed onto a substrate. At the same time, another argon ion source cobombards the substrate to enhance the breakdown of the graphite bonding in favor of a diamond-like $sp^3$ tetrahedral bond in the growing carbon film. The poor vacuum and relatively high pressure ($10^{-5}$ to $10^{-4}$ torr) in sputtering deposition is cumbersome and tends to introduce contamination of the film on a level comparable to those encountered in chemical vapor deposition and plasma enhanced chemical vapor deposition.

Therefore, while many attempts have been made to obtain high quality diamond-like carbon at commercial levels of production, the results have thus far been disappointing. The known methods recited above are deficient in many respects. While the ion beam deposition method produces a good quality film, its slow growth rates are impractical. The chemical vapor deposition and sputter methods are prone to contamination yielding an unacceptable film in most circumstances. All known methods require elevated temperatures, which often prove impractical if coating an optical substrate is desired. The known methods all involve complex and cumbersome devices to implement.

While natural diamond is a generally well defined substance, diamond-like carbon films are not well defined, possibly because the many different methods of preparation which contribute unique aspects to the product. From a structural view point, six allotropes of carbon have been identified—two for each of the numbers of dimensions through which the carbon atoms may bond. The two most important carbon allotropes of interest in the optics and semiconductor industries are the two dimensional $sp^2$ bonding characteristic of graphite, and the three dimensional $sp^3$ tetrahedral bonding which gives natural diamond its unique properties. The article *Low Pressure, Metastable Growth of*

*Diamond and Diamondlike Phases*, by John C. Angus and Cliff C. Hayman, 41 Science pp. 1913-21 (August 1988) describes different types of diamond-like phases, methods of production, and possible uses, the disclosure of which is expressly incorporated herein by reference for background.

Chemical vapor deposition techniques have been useful in obtaining diamond-like carbon material denoted "a-C:H," which is an amorphous carbon structure containing a significant amount of hydrogen. In fact, it is believed that hydrogen is necessary for permitting realistic growth of the metastable diamond-like material and that a reduction in the amount of hydrogen below about 20% degrades the film towards graphite. Of course the amount of hydrogen correlates with the proportions of $sp^3$ to $sp^2$ bonding and the correlation of diamond-like properties to graphite-like properties.

It appears that some ion-sputter techniques have been successful in producing diamond-like carbon material without hydrogen—so-called "a-C" film. (See, *Low Pressure, Metastable Growth of Diamond and Diamond-like Phases*, page 920, *supra*). Such a-C diamond-like carbon is interesting in that the ratio of $sp^3$ to $sp^2$ bonding is believed to be high, with a corresponding increase in diamond-like properties. Unfortunately, the growth rates of such a-C materials is extremely slow and not commercially viable. Apparently, attempts to increase growth rates using increased power densities in such ion sputter techniques resulted in a decrease in the ratio of $sp^3$ to $sp^2$ bonding.

Producing diamond-like carbon is just one example of the general problem of producing a layer of material having desirable physical properties where the material is extremely difficult to handle or manipulate. Examples of other such materials include semiconductors, such as silicon, germanium, gallium arsenide, and recently discovered superconducting materials which might be generally characterized as difficult to handle ceramics (e.g., yttrium-barrium compounds). Therefore, it would be a significant advance to achieve a method and apparatus which could produce an optical quality diamond-like layer having an abundance of $sp^3$ bonding (diamond qualities) in commercial quantities. Further, it would be significant if such method and apparatus were useful in producing layers of other types of materials which, using conventional technology, are difficult to handle or produce.

SUMMARY OF THE INVENTION

The present invention represents an improved apparatus, method and product which demonstrates advances in its ability to produce uniform (optical quality) dehydrogenated diamond-like carbon layers. Diamond-like carbon layers produced in accordance with the present invention have extremely desirable properties such as physical hardness, electrical strength, high thermal conductivity, and optical transparency. While the real parts of the indices of refraction of the diamond-like carbon of the present invention are interesting in that they approach the value of natural diamond (2.42) the greatest diagnostic significance lies in the imaginary parts of the indices of refraction (lossy part). It is believed that a small value (less than 1.0) of the imaginary part of the indices of refraction are proportional to the fraction of $sp^2$ bonding of diamond-like carbon film (provided the real part is reasonably constant). Natural diamond will approach an imaginary index of refraction of zero, indicating almost pure $sp^3$ bonding. Advantageously, the diamond-like carbon material produced by the method of the present invention has an imaginary index of refraction less than 1.0, and preferably less than 0.5, indicating a preponderance of $sp^3$ bonding. The optical quality of diamond-like carbon layers hereof have been produced at high growth rates exceeding 0.5 microns per hour over large areas (e.g., 20 square centimeters). As high growth rates are maintained, uniform deposition is achieved by providing an improved feedstock material, wherein the feedstock includes a tape of graphic foil such as pyrolytic graphite disposed within the laser beam path. The graphite foil is fed past the point of laser ablation and accumulated on a take-up reel. The tight bonding of each carbon atom into planar hexagonal nets in this type of graphite foil reduces the ejection of macroscopic particles (i.e., particles having dimensions greater than 1 micron or dimensions greater than the wavelengths of light being used in the particular optical application), and thereby prevents uneven deposition. Moreover, high growth rates are achieved by trailing electrons inherently attracted to the ions as the ions are placed upon the substrate. Not only do the trailing electrons improved growth rate, they also collide with the ions to increase the energy of the ion path.

An electrode can be incorporated within the laser beam path to accelerate ions and trailing electrons away from the graphite foil target and toward the substrate. In addition, the electrode provides deceleration of the ions and trailing electrons at a point just before the ions and electrons are deposited upon the substrate. Acceleration and deceleration are achieved by electrical fields between the target and an electrode and between the electrode and substrate, respectively. Furthermore, a secondary electrode can be placed within the ion path and charged relative to the substrate so that the particles can be selectively placed at specific locations upon the substrate. Selective placement of particles provide in situ etching of the substrate during the deposition of the early layers of particles.

Broadly speaking, the apparatus in accordance with the present invention includes a laser means directed within a vacuum chamber to impinge upon a continuous sheet of moving target material made of graphite foil placed within the chamber. The laser beam is focused upon the target material to ablate and eject a plume of carbon vapor whereby the plume is partially ionized by the laser beam. Ionization energies are achieved by focusing the laser beam upon the target material with sufficient energy, preferably greater than $1 \times 10^{10}$ W/cm$^2$, to both ablate and ionized carbon ions. A substrate is disposed within the chamber, to collect the ions and trailing electrons to produce a layer of dehydrogenated amorphous diamond-like material upon the surface of the substrate. For producing diamond-like material, an essentially pure graphite target, arranged in a hardened foil configuration, is used with the laser to ablate and eject a plume of carbon vapor and to ionize a portion of the plume to create the carbon ions. Given sufficient power density upon the graphite foil target, optical quality diamond-like film described herein can be produced. Preferably, the laser beam traverses the ejected plume to enhance the plume temperature. In a preferred embodiment, a primary electrode is positioned within the laser beam path to discharge through the plume to further increase the plume temperature by Joule heating. Furthermore, a secondary electrode is charged relative to the substrate to accelerate and then decelerate ions and trailing electrons in their path from the target toward the substrate. As the ions and electrons approach the substrate, they can then be directed and placed at specific locations upon the substrate.

The method of producing a layer of amorphic or ultra fine-grained diamond-like material in accordance with the present invention broadly comprises the steps of positioning a moving sheet of hardened graphite foil in a vacuum chamber, evacuating the chamber and directing a laser beam at an angle upon the graphite foil to obtain a plume of carbon substantially void of macroscopic particles having dimensions generally greater than 1 micron. The method further involves the steps of positioning a substrate in the chamber and positioning an electrical field disposed within the path of the laser beam between the substrate and the target, and then collecting a portion of the plume at selective points upon the substrate in accordance with the electrical field at a deposition rate greater than 0.1 microns per hour. Additionally, the method and apparatus of the present invention are believed to be capable of epitaxial growth of at least partially crystalline diamond-like carbon material. The diamond-like carbon material is substantially void of hydrogen and approaches the levels of hydrogen found in dehydrogenated natural diamond. Therefore, an advantage of the present invention is its ability to produce diamond-like layers having less than 25% hydrogen uniformly deposited across a substrate substantially void of macroscopic particles.

Preferably, the diamond-like carbon product produced by the preferred process has a real index of refraction approaching diamond (about 2.4) and an imaginary index of refraction substantially less than 1.0. The imaginary index of refraction is believed to be a good indicator of the fraction of $sp^2$ bonding, at least if the real part is reasonably constant. The diamond-like carbon hereof has an imaginary index of refraction preferably less than 0.5—indicating less than about 25% $sp^2$ bonding.

In the present application, the term "layer" has generally been used synonymously with coating of film and connotes material deposited or grown on a substrate and not diffused or deposited within the substrate. Also, it should be understood that the substrate is not necessarily a different material than the layer, but merely serves as a collection source for material. Thus, the substrate might comprise diamond or diamond-like carbon on which a layer of diamond-like carbon is received to produce a homogeneous part of uniform physical properties. Furthermore, it is understood that the film comprises dehydrogenated diamond-like material which includes amorphous diamond-like carbon and/or nanocrystals (i.e., ultra fine-grained diamond-like crystal having dimensions less than 1 micron).

In the present application "diamond-like carbon" has been used as a generic term for a material having some of the physical characteristics of diamond. In view of the physical properties of the materials produced in accordance with the present invention, the layer might alternatively be called diamond or amorphic diamond. The term "diamond-like carbon" generally includes carbon materials having both amorphous and microcrystalline atomic structures and containing anywhere from zero to 40% hydrogen concentration (although the diamond-like carbon of the present invention is generally dehydrogenated at less than 25%). However, it is believed the method and apparatus of the present invention can be used for the epitaxial growth of diamond in a substantially crystalline structure. Thus, the use of the term "diamond-like carbon," should not be understood to indicate a specific type of structure (e.g., amorphous, microcrystalline, large-grain polycrystalline, or single crystal) or specific types of compositions, such as percentage of hydrogen or other impurities in interstitial sites in grain boundaries. Specific structural or compositional characteristics are specifically stated.

DETAILED DESCRIPTION OF THE PREFERRED EMBODIMENTS

Figure 2:
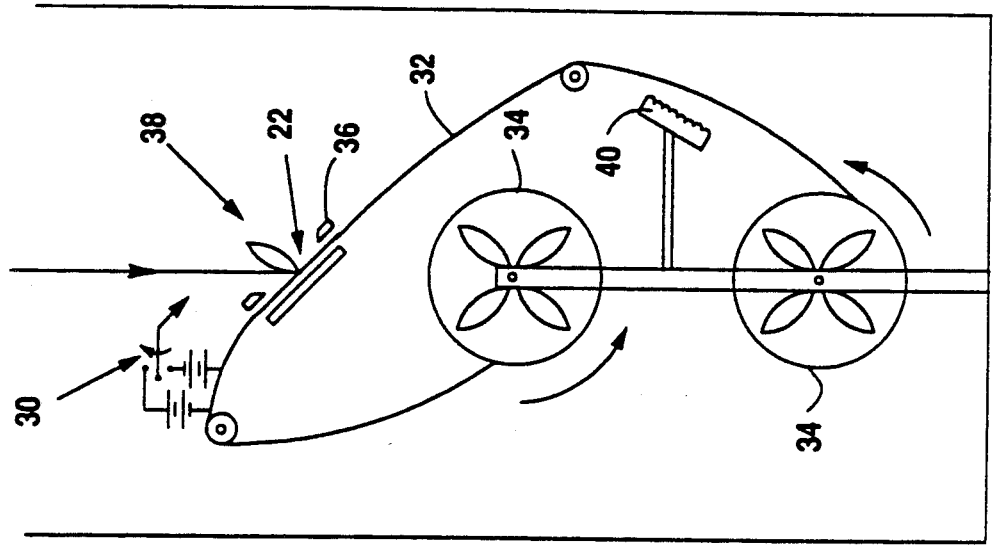
FIG. 2 is a schematic, fragmentary, vertical sectional view of another portion of the apparatus of the present invention.

Turning to the drawings, an apparatus in accordance with the present invention is illustrated. Broadly speaking, apparatus 10 includes laser beam 12 which enters sealed chamber 14 via one or more windows 16. Reflecting mirror 18 disposed within chamber 14 is used to reflect incoming beam 12 toward focusing lens 20. Lens 20 functions to focus beam 12 onto target 22. Substrate 24 is situated within chamber 14 to collect the layer of material produced by apparatus 10.

Figure 1:
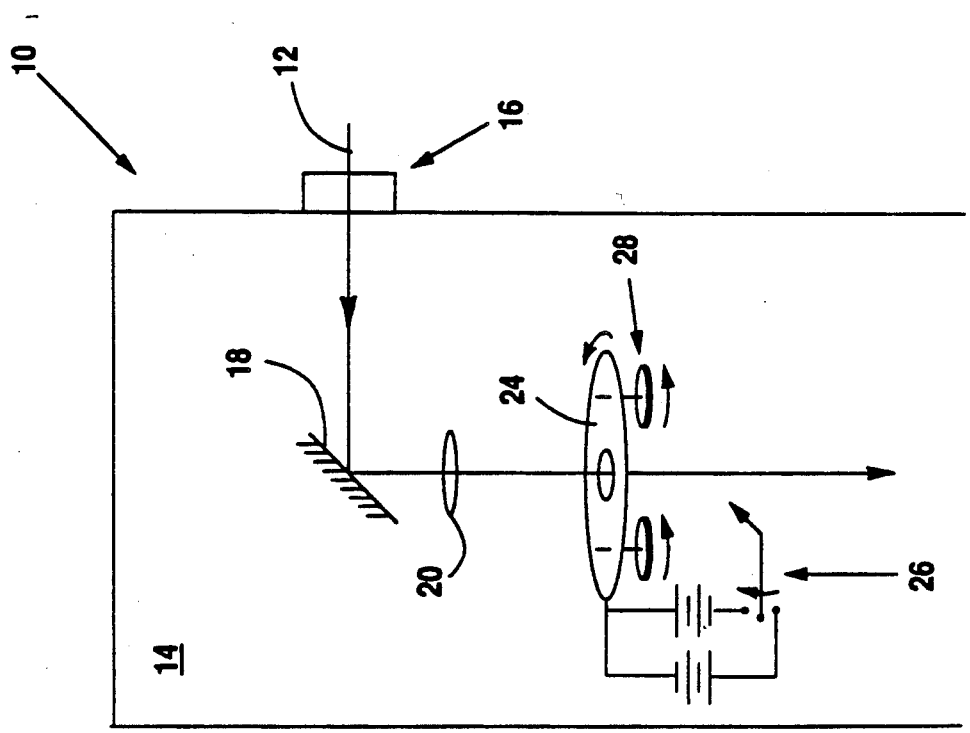
FIG. 1 is a schematic, fragmentary, vertical sectional view of a portion of the apparatus of the present invention.

In the illustrated embodiment, a Nd-Yag laser is preferably used to deliver laser beam 12, as schematically illustrated in FIG. 1. The Nd-Yag laser is operated in the Q-switch mode to deliver 250 millijoules at the focus point with a repetition rate of 10 Hz. A Molectron MY34-10 laser has been satisfactorily used. The present invention postulates that the power density delivered to target 22 is an important parameter in obtaining the best layer of material. It is believed that the focusing mechanism 20 is an important ingredient in achieving the desirable power densities as the actual output of laser beam 12.

Chamber 14 includes one or more windows 16 for observing and applying the laser. Chamber 14 includes a cylindrical shell of sufficient rigidity to withstand vacuum forces when chamber 14 is evacuated to about $1 \times 10^{-6}$ Torr. Although not illustrated, it is important to note that reflecting mirror 18, focusing mechanism 20, substrate 24, target 22, etc. are all rigidly secured within chamber 14.

Reflecting mirror 18 includes a highly reflective, smooth surface for redirecting the path of travel of laser beam 12 in chamber 14. The illustrated mirror is a 45° reflector, Part No. Y1-15-45 made by CVI Laser Corporation of Albuquerque, New Mexico. Focusing lens 20 includes a lens which receives the directed laser beam and focuses the beam to a focal point on target 22. The illustrated lens is a plano-convex lens, Part No. PLCX-25.4/39.2 made by CVI Laser Corporation. The spot size of the arrangement illustrated in FIG. 2 is believed to be on the order of 75 microns. However, it is believed desirable to use further optical improvements to achieve a smaller spot size, which of course would significantly enhance the power density of the energy delivered to target 22.

Although not shown, a shield mechanism can be provided within the beam path and between lens 20 and substrate 24 to shield or reduce the contamination of mirror 18 and lens 20 from particles. See parent U.S. Patent application Ser. No. 264,224, filed Oct. 28, 1988, for a description of such a shielding mechanism.

An important aspect of the present invention is secondary discharge electrode 26 configured proximate to the beam path and below substrate 24. Electrode 26 maintains a predetermined charge relative to substrate 24, wherein charged electrode 26 functions to form an electrical field between electrode 26 and substrate 24. The field is used to selectively place ions and trailing electrons upon the bottom surface of substrate 24 in accordance with the field. Thus, the present invention provides an electrical discharge through the plume between electrode 26 and substrate 24 in order to provide in situ etching of the substrate during the deposition of the early layers of particles. Diamond-like layers are selectively grown upon substrate 24 depending upon the magnitude and direction of field. Substrate 24 can be a uniform wafer of silicon (100). However, it being understood that a selection of the substrate material is dependent upon the type of film to be deposited. For example, it is believed that a substrate of Ni (110) permits a degree of epitaxial growth. Furthermore, substrate starting materials can be diamond-like material whereby diamond-like deposition will provide a homogeneous material.

As illustrated in FIG. 1, substrate 24 can be rotated about a central axis arranged colinear with reflected beam 12. An aperture within substrate 24 permits the beam to traverse the middle of rotating substrate 24. Rotary system 28 enables uniform deposition of particles upon the underneath side of substrate 24. A thin layer of particles are placed upon the substrate during each revolution such that numerous revolutions provide optical quality, uniform growth of diamond-like carbon material. Disposed below substrate 24 and electrode 26 is primary discharge electrode 30 shown in FIG. 2. FIG. 2 illustrates a portion of the present invention, wherein the other portion is shown in FIG. 1, i.e., FIG. 2 is a continuation of chamber 14 and of laser beam 12 focused upon a target 22. As can be seen in FIG. 2, the distal tip of electrode 30 is disposed proximate to the laser beam path of travel to discharge approximately coincidentally with or through the laser beam path of travel to target 22. Electrode 30 is charged and thereby functions to draw ions and free trailing electrons from target 22, shown in FIG. 2, toward substrate 24, shown in FIG. 1. As the ions and electrons, or particles, are withdrawn, they are accelerated within the laser beam path to increase the energy thereof necessary for placement upon the substrate 24 in diamond-like form. It is important to note that because electrode 30 is disposed between target 22 and substrate 24, particles are accelerated and heated as they are withdrawn from target 22 and are decelerated as they approach substrate 24. Deceleration enables particles to be deposited gently upon the surface layer of substrate 24. Current flowing between secondary electrode 26 and substrate 24 continuously cleans the substrate and film as it grows.

As shown in both FIGS. 1 and 2, primary electrode 30 and secondary electrodes 26, can be of...either positive or negative polarity relative to target 22 or substrate 24, respectfully. A switch is shown to place either a positive or negative polarity charge upon either electrode. It should be noted that the presence of an electric field, and not solely the polarity of that electric field, is an important aspect of the invention. The polarity in either case can be selected to provide optimal particle growth at selected points upon the substrate 24 without accumulating undesirable macroscopic particles at those points.

In the illustrated embodiment of FIG. 2, target 22 is preferably a tape of graphite foil containing hardened pure graphite as might be obtained from Union Carbide UCAR Carbon Company of Cleveland, Ohio, GTA Premium GRAFOIL. Graphite foil, such as found in pyrolytic graphite foil, shows significant resistent to fragmentation and is of sufficient hardness to prevent ejection of macroscopic particles from the target during ablation and ionization. Thus, the hardened graphic foil prevents substantial amounts of large macroscopic particles which exceed 1 micron in dimension from being ejected during ablation. The tape of graphite foil 32 is continuous and is moving in accordance with rotating take-up reels 34. By moving graphite foil 32 during ablation, fresh target material is constantly presented to the laser beam. Prolonged ablation of the same target location causes cratering in the material and a reduction in power density. Take-up reels 34 and holder assembly 36 are preferably made of graphite similar to the composition of graphite foil 32. Graphite holder assembly 36 confines and directs the movement of graphite foil 32 through ablation point in a smooth fashion, while the graphite take-up reels 34 provide the constant linear speed of foil 32 through the holder. Constant movement of foil 32 provides fresh target material in a constant power density at plume location 38. Heater 40 disposed adjacent one side of moving foil 32, provides outgasing and other conditioning of the graphite foil. Conditioning of foil 32 prior to ablation helps maintain structural integrity of the foil and reduces ejection of macroscopic particles during ablation. Conditioning generally refers to the process of gently evaporating, 1) adsorbed, 2) absorbed, and 3) bonded impurities such as water vapor which would otherwise superheat and explode fragments of graphite during laser ablation.

An important aspect of the present invention is the angle in which laser beam 12 strikes target 22. As shown in FIG. 2, the angle can be adjusted such that ablated macroscopic material can be ejected perpendicular to the target surface and thus at an angle away from substrate 24. As is commonly shown in conventional devices, the planar target is fixed perpendicular to the laser beam. In such a configuration, ejected macroscopic particles have a tendency to follow the laser beam path and electrical field directly back onto the substrate. By placing the longitudinal axis of target 22 at an angle, non-perpendicular to the laser beam path, substantial amounts of macroscopic particles can be ejected perpendicular to the surface of the target and thus away from the field and laser beam path. Thus, fewer macroscopic particles are placed upon the substrate when target 22 is disposed at an angle, non-perpendicular to the laser beam path 12. Even though angle adjustment provides a reduction in macroscopic deposition, non-macroscopic deposition rates remain fairly constant over broad adjustment angles. Fairly constant deposition rates of non-macroscopic particles are achieved independent of angle of adjustment since non-macroscopic particles (particles less than 1 micron in dimension) are postulated to be more susceptible to being guided toward substrate 24 than are larger macroscopic particles. Angle adjustment of target 22 is achieved by simply adjusting the angle of graphite holder assembly 36.

In use, chamber 14 is evacuated to about $1 \times 10^{-6}$ Torr and laser beam 12 is shown in FIG. 1 as entering chamber 14 through window 16. Laser beam 12 is preferably generated from a Nd-Yag laser which deliver approximately 250 millijoules a repetition rate of 10 Hz in about 15 nanosecond pulses. Beam 12 is focused by focusing lens 20 such that it produces about $5 \times 10^{11}$ watts per square centimeter on target 22. When pulsed, laser beam 12 impinges upon target 22 and ejects a plume 38 containing carbon ions and small amounts of trailing electrons from the surface of target 22 approximately perpendicular to the surface of target 22. That is, plume 28 can be adjusted at various angles from the travel path of impinging beam 12. If holder assembly 36 is adjusted in a horizontal position, then plume 38 will be colinear with impinging beam 12. However, by arranging target 22 at an angle from horizontal, plume 38 will not be colinear with beam 12. A non-colinear arrangement will decrease the amount of macroscopic particles accelerated towards substrate 24. Non-colinear arrangement thereby provides extraction of substantial quantities of undesirable macroscopic particles in a direction away from substrate 24. As shown in FIG. 2, when holder assembly 36 is configured at an angle relative to horizontal position, plume 38 becomes non-colinear with impinging beam 12. The plume is schematically illustrated as about a 30° cone, but it should be understood that the density of material in the plume is more concentrated in a cone about several degrees in diameter.

Without being bound by theory, it is believed that total energy delivered to the plume of ejected target material is critical to the production of optical quality diamond-like carbon in accordance with the present invention. For this reason, it is believed desirable to have laser beam 12 traverse at least a part of plume 38. Contrary to current belief, it is postulated that an increase in power density delivered to target material 22 yields a more desirable diamond-like carbon material (a-C film). Thus, it is believed that substitution of a laser mechanism capable of larger laser pulse energy would improve the quality—increase the proportion of $sp^3$ bonding—of the diamond-like carbon produced, as well as possibly increasing deposition rate. Further, a focusing lens 20 with a smaller spot size is expected to increase the quality of the diamond-like carbon material produced, because a tighter focus gives a higher temperature to a smaller amount of carbon material in the plume 38. However, it is expected that a tighter focus would give a smaller growth rate.

Electrode 30 has been found to provide a relatively inexpensive opportunity to further increase the power density in plume 38. As can be seen in FIG. 2, the disposition of the tip of electrode 30 is provided proximate to the laser beam path of travel, with the discharge desirably traversing the plume. Thus, with the laser beam ionizing carbon particles in the plume, the discharge of electrode 30 most readily occurs through the ionized plume. This auxiliary discharge further increases plume plasma temperature by Joule heating in the relatively small volume of the ablation plume.

While electrode 30 provides Joule heating of the plume, it also provides a guide for ions and trailing electrons to follow in their path from target 22 to substrate 24. As holder assembly 36 rotates at an angle about the horizontal, macroscopic particles eject generally perpendicular to target 22 whereas plume 38, containing ions and trailing electrons, tend to eject toward electrode 30 along the beam path of travel. Thus, electrical discharge of electrode 30 aids in drawing desirable non-macroscopic particles toward substrate 24. It is thereby postulated that plume angle of ejection is therefore between the perpendicular ejection angle of macroscopic particles and the laser beam path when holder 36 is at an angle as shown in FIG. 2. Further, electrode 26 operates to provide additional direction or guidance of ions and trailing electrons upon substrate 24. Charging electrode 26 will provide electrical discharge between electrode 26 and substrate 24. Discharge of electrode 26 will then place ions and trailing electrons upon substrate 24 at precise locations during the rotation of substrate by rotary system 28. Selective placement will effectually provide in situ etching of the substrate during the deposition of the early layers of particles.

Operation of apparatus 10 provides deposits of an optical quality diamond-like carbon layer on substrate 24. The layer can be either amorphous diamond-like carbon or nanocrystals having crystal dimensions less than 1 micron. The layer of diamond-like carbon film is grown at rates of about 0.5 microns per hour in a 20 square centimeter area. In FIG. 1, the substrate is about 5.5 centimeters from target 22 and the radial expansion of the ejected material in the plume produces a domed profile thickness on substrate 24. Optical quality of this domed profile diamond-like carbon (A-C) layer gives a visual appearance of bright Newton's rings of interference. Thickness varies over the a-C film from 0.1 to 0.2 microns.

Figure 3:
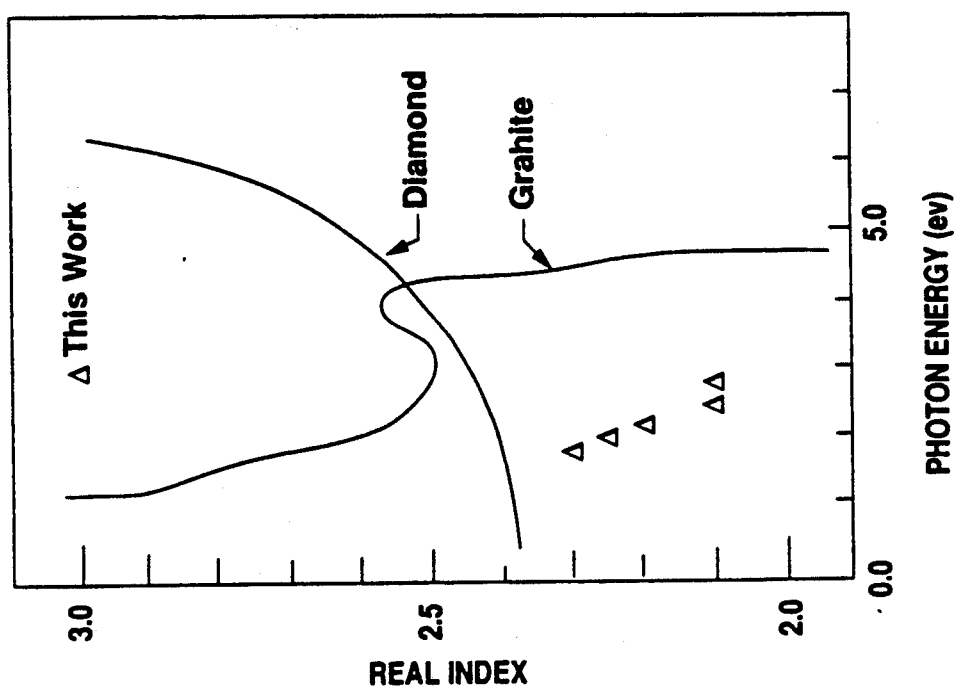
FIG. 3 is a plot showing real indices of refraction of various samples of a-C film produced in accordance with the present invention.

Of major importance in the production of optical quality a-C films is the type of target or feedstock used in generating the carbon particles. The present invention utilizes a novel feedstock or target 22 which includes a tape of hardened graphite foil such as pyrolytic graphite. The advantages in using hardened graphite foil rather than conventional graphite, is that ejection of macroscopic materials is minimized. Also, a foil is advantageous in that it is resistant to fragmentation. Heater 40 provides thermal outgasing and general conditioning of the foil before the moving foil is struck by beam 12. Outgasing is a desired outcome for removing impurities such as water vapor prior to being received by beam 12. The following FIG. 3 is a plot of the real indices of refraction of various samples of a-C film produced in accordance with the present invention. FIG. 3 shows the experimental results versus expected values of natural diamond and graphite. The experimental results using apparatus 10 of the present invention approaches the value of 2.42 for natural diamond.

Figure 4:
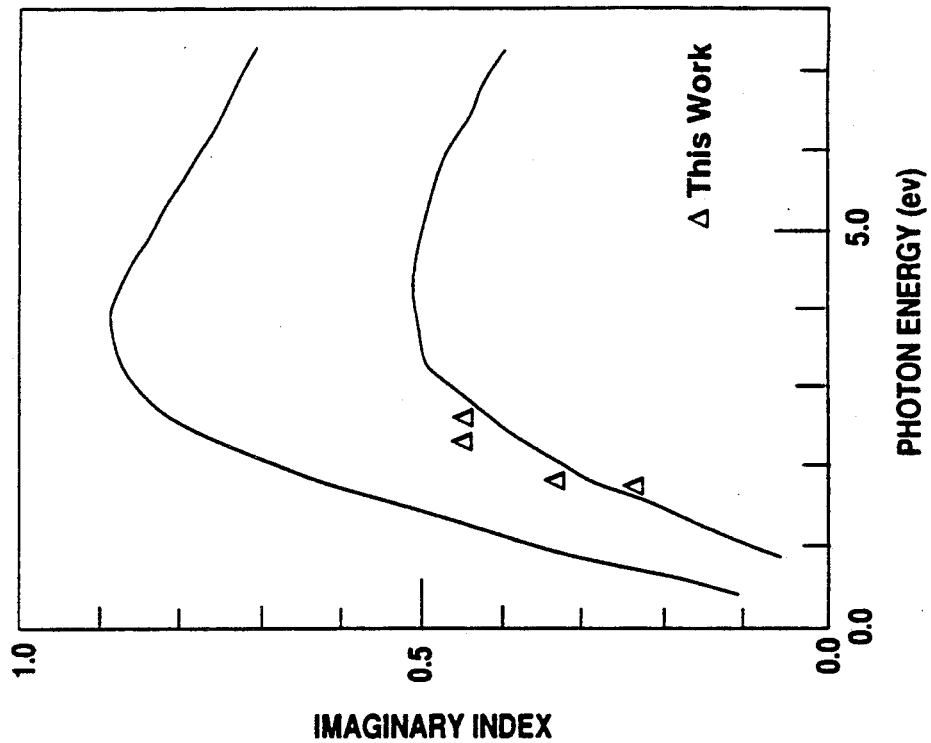
FIG. 4 is a plot showing imaginary indices of refraction of various samples of a-C film produced in accordance with the present invention.

It is believed, however, that the greatest diagnostic significance lies in the imaginary parts (loss) of the indices of refraction as shown in FIG. 4. It is believed that at small indices (less than 1.0) the imaginary parts of the indices of refraction are approximately proportional to the fraction of $sp^2$ bonding in the film, provided the real parts are reasonably constant. Purely diamond-like $sp^3$ bonding would give no loss at these photon energies. It is believed that the curve labeled A in FIG. 4 is identified with an approximately 25% content of graphitic, $sp^2$ bonds. *See,* N. Savvides, 58 *J. Appl. Phys.,* 518 (1985);

59 *J. Appl. Phys.*, 4133 (1986) (expressly incorporated herein by reference for background). The a-C films produced by the present invention are believed to have about 25% or less $sp^2$ bonding as shown in FIG. 4. Contrary to current belief, it is postulated that residual $sp^2$ bonds are an artifact of production and are not necessary for stability of the remaining diamond-like $sp^3$ bonding Therefore, it is believed that a dehydrogenated a-C film can be grown by the apparatus of the present invention in which the $sp^2$ bonding is minimal, resulting in characteristics approaching that of natural diamond.

Figure 5:
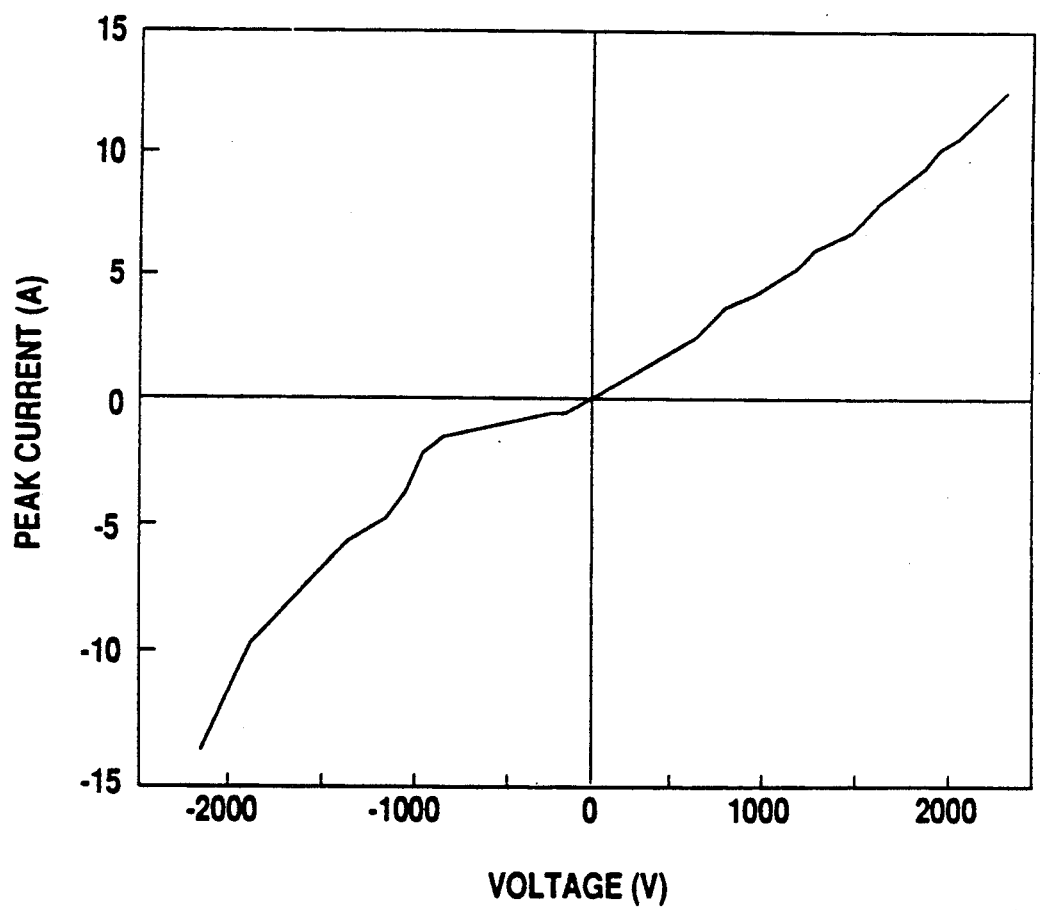
FIG. 5 is a plot showing experimental results of a coil placed along the laser beam path of the present invention.

Experimentally, a Rogowski coil was placed along the laser beam path of travel between the electrode 30 and target 22. FIG. 5 illustrates the experimental results. From the time dependency of the current, it appears that current flows only when material in the plume is filling the space between the electrode 30 and target 22, as would be expected.

The asymmetric voltage/current characteristics shown in FIG. 5 is typical of a gas-filled diode with a "forward" direction with the conduction shown in the first quadrant being established when the plume is negative—and thus is able to function as a hot filament. The selection of either positive or negative voltages gives the same absolute value of current and generally yields very similar depositions of the a-C film on the substrate 24.

Operation of apparatus 10 appears successful due to high laser intensity in the ablation plume and the discharge current from electrode 30. In addition, higher quality films are produced by aspects of the present invention, including 1) the improved feedstock or target material 22, 2) electrode 26 and 3) non-colinear arrangement of plume 38 and beam 12. Improved target material comprising graphite foil arranged at various angles about the horizontal plane, provides a more uniform and higher quality a-C film upon substrate 24. Further, electrode 26 discharge provides in situ etching of the substrate during the deposition process.

Contrary to current belief, it is postulated that the ablated material in the plume must be travelling as a largely neutral plasma. That is, the carbon ions existing in the plume are believed to be transported currently with trailing electrons. Therefore, it is believed that ion beam sputtering techniques with very low growth rates (e.g., 500 Angstroms per hour) are fundamentally limited in their ability to reach high power densities at high enough values of fluence to be practical. Further, the imaginary indices of refraction (losses) of the a-C film produced in accordance with the present invention indicates that $sp^2$ bonding can be further reduced by using a laser of higher power and a focusing mechanism or lens to produce a smaller spot size. Meanwhile, the improved target material can withstand laser beams of higher power and smaller spot size without producing large amounts of undesirable macroscopic particles upon substrate 24.

The instant invention has been disclosed in connection with specific embodiments. However, it will be apparent to those skilled in the art that variations from the illustrated embodiments may be undertaken without departing from the spirit and scope of the invention. For example, graphite foil target material can be any type of target material having carbon particles arranged in a sufficient structure necessary to withstand significant amounts of macroscopic particle ejection when stricken by a high-power laser beam. Additionally, holder assembly 36 can be rotated at any angle from 0° to almost 90° from the horizontal position provided that the angle chosen is one that will allow minimum macroscopic particle contamination of substrate 24. Still further, electrodes 26 and 30 can be charged at any polarity and magnitude relative to substrate 24 and target 38, respectfully, as long as acceleration, deceleration, selective placement and substrate cleaning are the desired outcome. These and other variations will be apparent to those skilled in the art and are within the spirit and scope of the invention.

What is claimed is:

1. A method of producing a layer of dehydrogenated diamond-like film having both amorphous and microcrystalline atomic structures, comprising the steps of:
   positioning a moving sheet of hardened graphite foil in a vacuum chamber;
   evacuating the chamber;
   providing a laser beam;
   focusing said laser beam at a non-perpendicular angle upon said graphite foil to obtain a plume of ions;
   positioning a substrate in said chamber;
   directing said plume toward said substrate; and
   collecting a portion of said plume at selective points upon said substrate at a deposition rate greater than about 0.5 microns per hour, as a layer of said dehydrogenated diamond-like film substantially void of macroscopic particles.

2. The method as recited in claim 1, wherein said directing step further comprises:
   providing a first charged electrode proximate to the path of travel of said laser beam between said graphite foil and said substrate;
   discharging said first electrode through said plume to increase the temperature of said plume and accelerate said ions toward said substrate and decelerate said ions just prior to deposition upon said substrate;
   providing a second charged electrode proximate to the path of travel of said laser beam between said first charged electrode and said substrate; and
   discharging said second charged electrode through said plume to selectively place said ions upon said substrate and to clean said substrate as said ions are being placed upon said substrate.

3. The method as recited in claim 1, wherein said laser beam being directed through the plume.

4. The method as recited in claim 1, further comprising aligning said graphite foil such that when said laser beam strikes said graphite foil at a non-perpendicular angle, said macroscopic particles are ejected away from and not toward said substrate.

5. The method as recited in claim 1, wherein said laser beam is configured to intersect a portion of said plume at a point where the plume is formed from said foil.

6. The method as recited in claim 1, wherein said hardened graphite foil is of sufficient hardness to prevent ejection of macroscopic particles exceeding 1 micron in dimension.

* * * * *

UNITED STATES PATENT AND TRADEMARK OFFICE
CERTIFICATE OF CORRECTION

PATENT NO. : 5,098,737

DATED : February 25, 1992

INVENTOR(S) : Norman Brammer, et al

It is certified that error appears in the above-identified patent and that said Letters Patent is hereby corrected as shown below:

At column 3, line 68, "25" is deleted.

Signed and Sealed this

Third Day of November, 1998

Attest:

BRUCE LEHMAN

Attesting Officer     Commissioner of Patents and Trademarks